(12) United States Patent
Lakhani et al.

(10) Patent No.: US 7,120,068 B2
(45) Date of Patent: Oct. 10, 2006

(54) COLUMN/ROW REDUNDANCY ARCHITECTURE USING LATCHES PROGRAMMED FROM A LOOK UP TABLE

(75) Inventors: Vinod Lakhani, Palo Alto, CA (US); Benjamin Louie, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 768 days.

(21) Appl. No.: 10/206,044

(22) Filed: Jul. 29, 2002

(65) Prior Publication Data

US 2004/0019763 A1    Jan. 29, 2004

(51) Int. Cl.
*G11C 7/00* (2006.01)

(52) U.S. Cl. ............ 365/200; 365/230.06; 365/230.03; 365/189.05; 365/230.08

(58) Field of Classification Search ........... 365/230.03, 365/230.06, 189.05, 230.08, 200
See application file for complete search history.

(56) References Cited

U.S. PATENT DOCUMENTS

| | | | | |
|---|---|---|---|---|
| 5,454,107 A | * | 9/1995 | Lehman et al. | ............. 711/153 |
| 5,778,413 A | * | 7/1998 | Stevens et al. | ................ 711/5 |
| 5,909,404 A | * | 6/1999 | Schwarz | ...................... 365/201 |
| 5,940,597 A | * | 8/1999 | Chung | ......................... 709/242 |
| 6,009,495 A | * | 12/1999 | DeRoo et al. | .............. 711/103 |
| 6,025,840 A | * | 2/2000 | Taylor | ........................ 715/790 |
| 6,124,865 A | * | 9/2000 | Meinerth et al. | ........... 345/501 |
| 6,154,389 A | | 11/2000 | Chung et al. | |
| 6,167,499 A | * | 12/2000 | Letham | ...................... 711/212 |
| 6,172,921 B1 | | 1/2001 | Park et al. | |
| 6,191,984 B1 | | 2/2001 | Noh | |
| 6,199,140 B1 | * | 3/2001 | Srinivasan et al. | ......... 711/108 |
| 6,208,568 B1 | | 3/2001 | Zagar et al. | |
| 6,282,706 B1 | * | 8/2001 | Chauvel et al. | ............. 717/150 |
| 6,308,218 B1 | * | 10/2001 | Vasa | ......................... 709/238 |
| 6,643,188 B1 | * | 11/2003 | Tanaka et al. | ......... 365/189.01 |
| 6,757,842 B1 | * | 6/2004 | Harari et al. | ................... 714/7 |

OTHER PUBLICATIONS

Brent Keeth and R. Jacob Baker, DRAM Circuit Design, c 2001, pp. 108-116.

* cited by examiner

*Primary Examiner*—Viet Q. Nguyen
(74) *Attorney, Agent, or Firm*—Dickstein Shapiro LLP

(57) ABSTRACT

A scheme for defective memory column or row substitution is disclosed which uses a programmable look-up table to store new addresses for column selection when certain column or row addresses are received. The new addresses are loaded into a programmable fuse latch each time an address transition is detected in the input address.

65 Claims, 7 Drawing Sheets

COLUMN/ROW REDUNDANCY ARCHITECTURE USING LATCHES PROGRAMMED FROM A LOOK UP TABLE

FIELD OF THE INVENTION

This invention relates to the field of memory devices and more particularly, to a column/row redundancy architecture for semiconductor memory.

BACKGROUND OF THE INVENTION

As memory chip manufacturers strive to decrease die size, and increase capacity and speed they must contend with an increased percentage of defective, or faulty memory cells. Different approaches have been taken to overcome detected memory cell defects. One approach has been to "repair" out a defective memory column or row by "flagging" the defective column or row and using redundant columns or rows of memory cells that are substituted for defective columns or rows. A defective region is marked as defective by blowing fuses, or anti-fuses, or lasers are used to etch circuits, to set latches which remap the defective column or row to a non-defective fully-operable redundant column or row. With this re-mapping, attempts to address the defective column or row will be redirected to address the redundant column or row known to be properly working.

Referring to FIG. 1, a portion of a conventional column redundancy repair fuse array 10 for a flash memory is shown. Fuse Array 10 contains a series of eight fuse sets 100, although only two fuse sets, Fuse Set$_0$ and Fuse Set$_7$, are shown for simplicity. The eight fuse sets 100 permit the redirecting of eight defective addressed columns to eight operable redundant columns. Each fuse set 100 contains fourteen fuses 102, Fuse$_0$ . . . Fuse$_{13}$, although only fuses Fuse$_0$ and Fuse$_{13}$ are shown in FIG. 1 for simplicity. Each fuse 102 stores one bit of an address and contains a latch 118 formed of a pair of inverters 110a and 110b. An Fbias control line 104 acts on transistors 111, 111' which form an isolation circuit for the latch 118. When the Fbias control line 104 is enabled and word line WL0 106 is enabled, a complementary bit pattern stored in flash transistors 113, 113', representing a stored address bit is written to latch 118. Disabling the Fbias 104 isolates the latch 118 from the storage transistors 113, 113' for programming of transistors 113, 113'.

Thus, each fuse 102, e.g. Fuse$_0$, in FIG. 1, stores in the associated latch 118 one address bit that is used for comparison with a corresponding bit of an incoming column address. For example, the first bit, Address Bit$_0$, of an incoming address will be input to XOR gate 114 which compares the address bit to the address bit stored in latch 118. The result of the comparison is output through conductive line 116. If the logic value of Address Bit$_0$ is the same as the logic value of stored in latch 118 then conductive line 116 will carry a logic value of one. If they are not the same, then conductive line 116 will carry a logic value of zero. The resulting output of each of the Fuse$_0$ . . . Fuse$_{13}$ in the fuse set$_0$ 100 are then compared in AND gate 150, to see if all of the incoming address bits are the same as all of the corresponding latch stored values. Each fuse set 100 is associated with a unique redundant column in a memory array. Thus, if there is an address match detected by AND gate 150 for a memory access a redundant column is utilized in place of the original defective column.

The problem with this approach is that since each fuse set 100 is permanently set with the address of a defective column, the number of defective columns which can be repaired is limited by the number of fuse sets 100 fabricated on the die. In the prior art example of FIG. 1, only eight defective columns may be re-addressed. Additionally, fuse arrays 10 consume die space. Accordingly, adding more fuse sets 100 to provide increased repair possibilities unduly increases die size.

BRIEF SUMMARY OF THE INVENTION

The present invention implements column or row redundancy using a single group of reloadable latches and associated XOR logic, which upon a change in an incoming address dynamically reloads the latch with new redundancy information associated with the specific incoming addresses. Since the latches are reloaded with new redundancy addresses for each incoming address transition, a given capacity of redundant columns or rows can be accommodated with fewer fuse circuit elements. This provides for considerable die area savings compared to traditional implementations of column or row redundancy.

In a preferred embodiment the present invention provides redundant global columns or redundant rows for each memory array bank and repairs out a faulty global column or row with a redundant global column or redundant row. A defective global column or row address is stored in a programmable look up table and is loaded into address latches for comparison in an XOR gate with incoming global column or row addresses. For column repair the look up table also includes stored information assigning the redundant column to a particular location in an output path.

These and other features and advantages of the invention will be more readily understood from the following detailed description of the invention which is provided in connection with the accompanying drawings.

DETAILED DESCRIPTION OF THE INVENTION

The present invention can be used for substitution of a redundant memory line containing memory elements for a defective memory line containing memory elements. The invention can be used to substitute a redundant column line for a defective column line, or for substitution of a redundant row line for a defective row line in a memory device. However, to simplify the description, the invention will be described in connection with the substitution of a redundant column for a defective global column in a flash memory device. It should be understood, however, that the invention can be used to substitute a redundant column for a defective column or a redundant row for a defective row in any type of memory device.

During memory device testing when a defective column is detected its address is stored in a lookup table, where the column maybe a global column. After testing, when the memory array is in use, a memory access to an identified defective column is remapped to a redundant column using the address stored in the look up table. The look up table contains rows of memory devices for use in storing the addresses of defective columns. The look up table rows are addressed whenever a sector or block address transition is detected. The column address stored in the addressed look up table row is loaded into latches of a fuse set logic array for comparison to an incoming global address. If an incoming column address matches an address in the fuse set logic array, then a redundant column is activated and used in place of a defective column. This process for determining defective column addresses and redirecting is described below. In this manner, the fuse set logic array is not limited to comparing only one address per fuse set, but can be loaded upon a change in sector or block addressing with different defective column addresses for comparison with an incoming address, thereby enabling a given number of fuse sets of a fuse array to handle a larger number of defective columns than the number of fuse sets.

Figure 1:
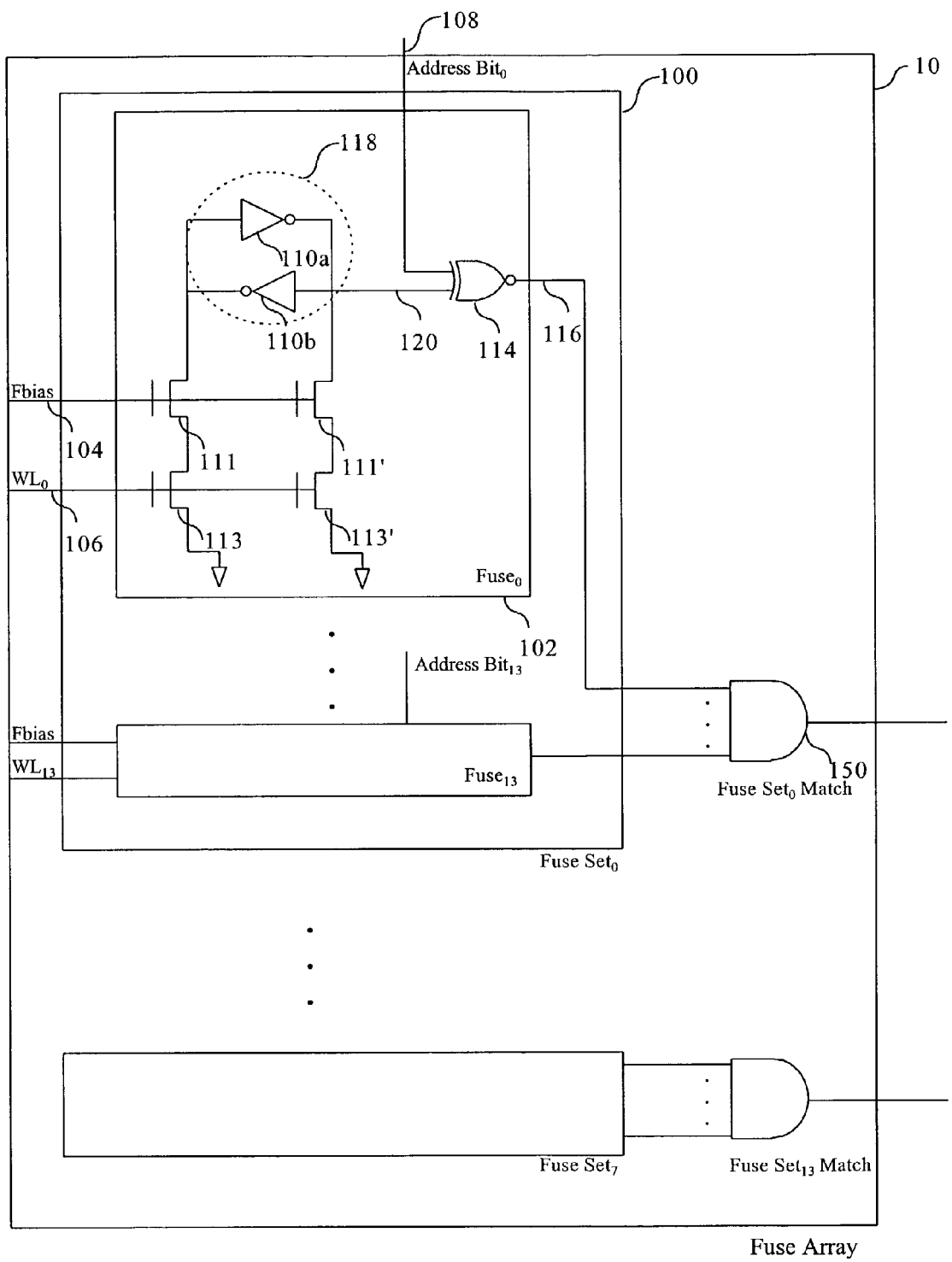
FIG. 1 is a representational schematic diagram of a column repair circuit in the prior art.
Figure 2:
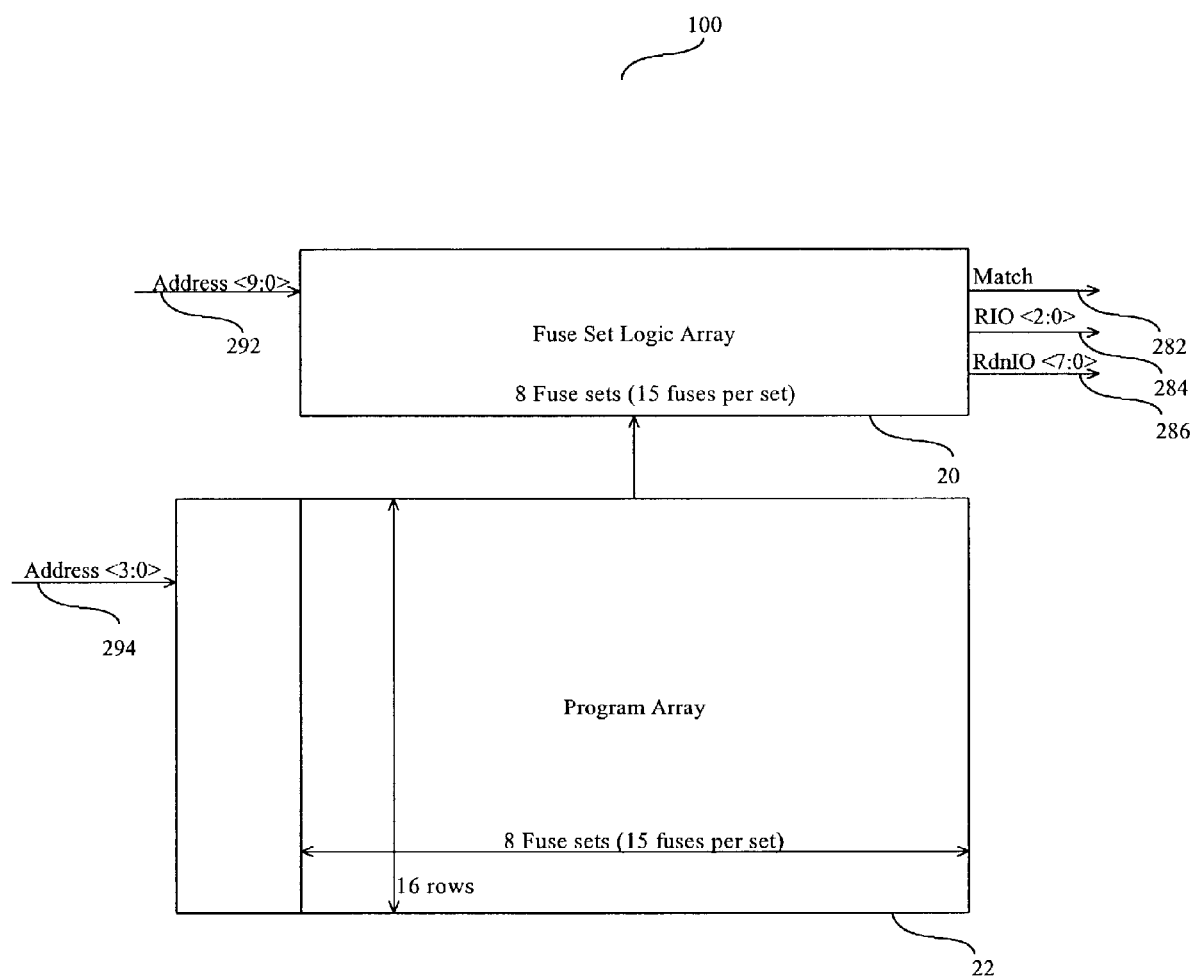
FIG. 2 is a block diagram of a column repair circuit in one embodiment of the present invention.

FIG. 2 is a block diagram of an exemplary embodiment of the present invention and comprises a fuse set logic array 20 and a program array 22 in the form of a look up table. The fuse set logic array 20 contains the latches and address comparator; it compares a incoming column address, carried into the fuse set logic array 20 on line 292, with a stored address from program array 22 and set into the latches in logic array 20 corresponding to a defective column. A match is indicated if the incoming address corresponds to the stored address and is indicated on line 282. Furthermore, re-addressing information also contained in the program array 22 and loaded into latches of logic array 20 is carried on RIO <2:0> lines 284. Additional readdressing information determined by the logic array 20 is carried on RdnIO <7:0> lines 286. In this exemplary embodiment, the fuse set logic array 20 has eight (8) fuse sets, with fifteen (15) fuses in each fuse set. Each fuse set represents a redundant column which is remapped from a defective column.

The program array 22 is a lookup table that stores the addresses of defective columns and substitute redundant column information. In this embodiment, the program array 22 has sixteen (16) rows and one hundred twenty columns of memory cells for storing information. Each row contains eight (8) fuse sets each containing fifteen (15) bits and their complements of column information. This corresponds to storage of sixteen (16) sets, one per row, of redundant column information with each set containing eight stored defective addresses, one for each fuse set in logic array 20.

When a portion of an incoming higher order address, e.g., the sector or block address, carried on line 294 to the program array 22, indicates a sector or block change, the corresponding information for the defective columns in that sector or block stored in program array 22 is loaded into fuse set logic array 20 for use in comparison with an incoming address and for output of remapping information on output lines 284 and 286.

Figure 3:
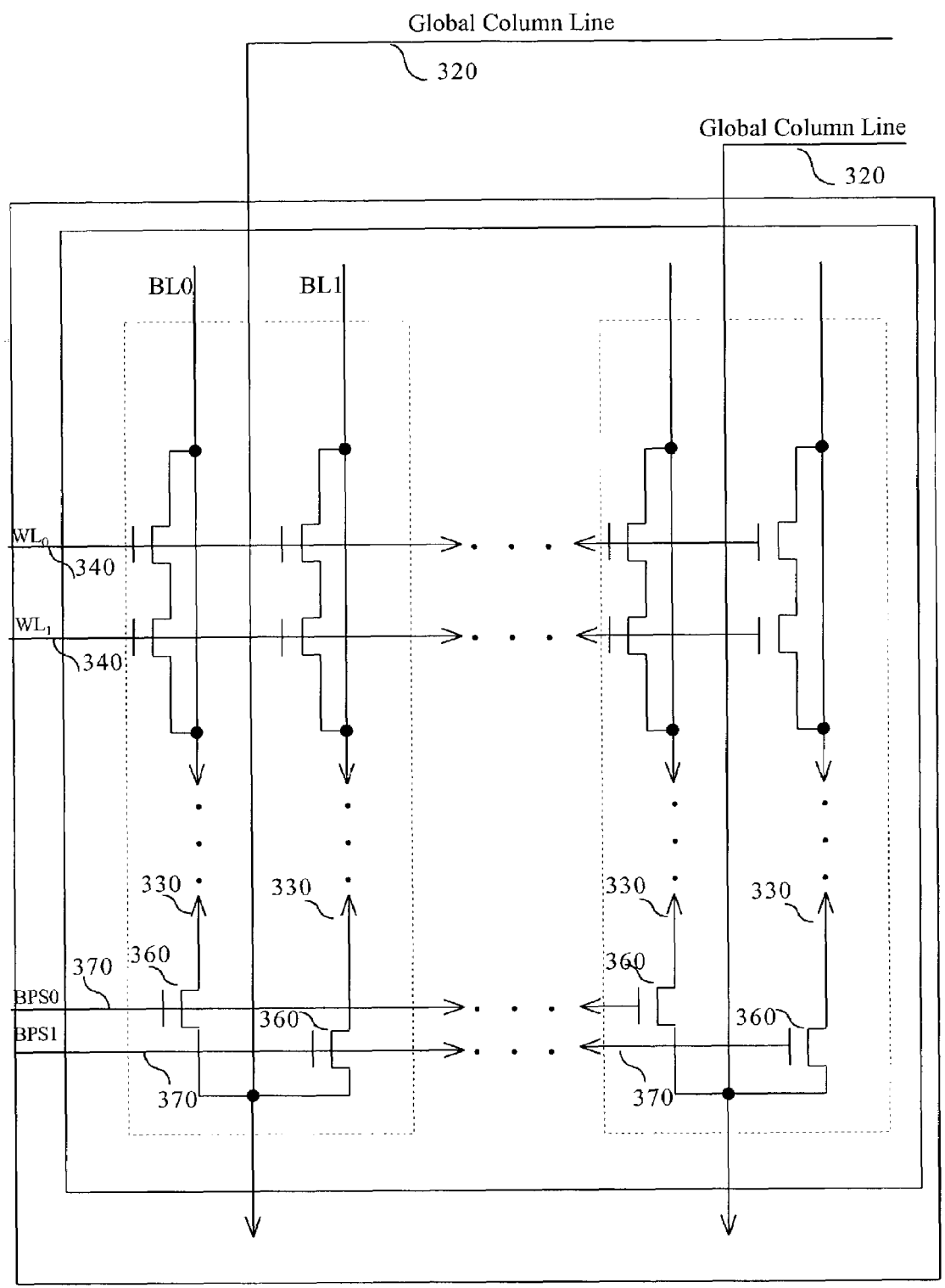
FIG. 3 is a schematic diagram of a flash memory array in one embodiment of the present invention.

FIG. 3 illustrates a portion of a flash memory array with which the invention may be used having multiple global column lines 320, associated with local column (bit) lines $BL_0$, $BL_1$, and multiple row lines $WL_0$, $WL_1$ . . . . In this flash memory array, a global column line is coupled to several "local" column lines. Control lines 370 BPS0 & BPS1 act on transistors 360, 360' to form an isolation circuit for the local column lines 330 from the global column line 320. Enabling the transistors 360, 360' couples the respective local column line 330 to the global column line 320.

Figure 4:
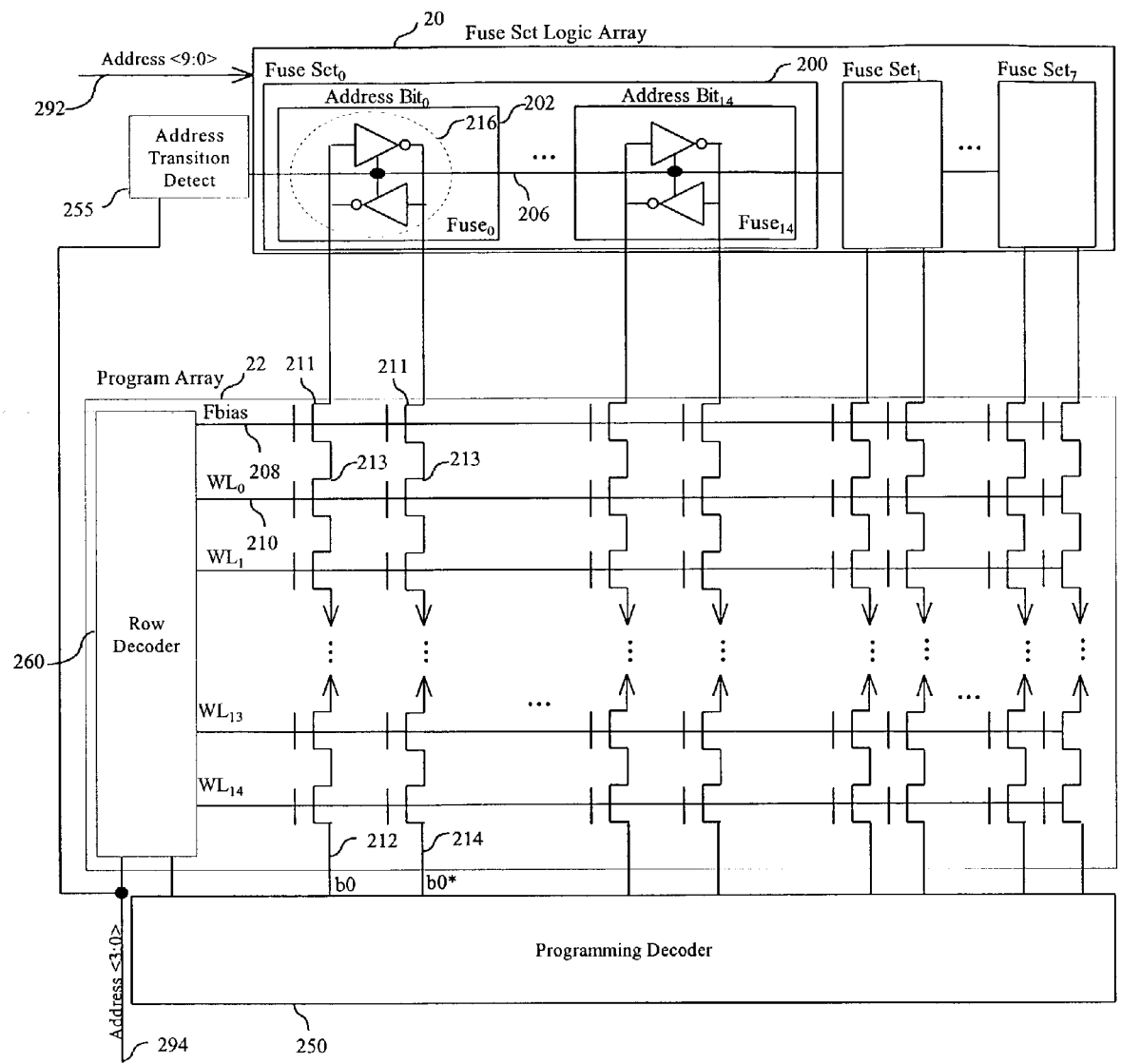
FIG. 4 is a schematic diagram showing further details of the FIG. 2 embodiment.

FIG. 4 illustrates a portion of the fuses 202 containing latches 216 for the fuse set Fuse $Set_0$ of logic array 20 (FIG. 2) as well as a portion of the rows and columns of the program array 22 for storing information which is loadable into the latches 216. One of the advantages of the present invention is that the latches 216 are reloadable with information from program array 22 which simplifies the circuitry of the fuse set logic array 20. During the testing of the memory, the addresses of defective global memory columns, as well as information indicating where a redundant global column is to be used for substitution in the data output circuit are stored in the rows of program array 22, indicated by the row word lines $WL_0$ . . . $WL_{14}$. The latches 216 of fuses 202 of the fuse set logic array 20 of FIG. 4 are loaded with information from the program array 22 each time a column sector address transition is detected by address transition detect circuit 255. As noted, in the illustrated embodiment, the fuse set logic array 20 has eight (8) fuse sets 200 (Fuse $Set_0$ . . . Fuse $Set_7$), each of which contains fifteen (15) fuses 202 (Fuse$_0$ . . . Fuse$_{14}$). Each fuse set 200, when loaded, contains information identifying a defective column and further identifying where a redundant column associated with the fuse set 200 is to be used in an output data path. Although particular address sizes, numbers of fuses and numbers of fuses sets are used for illustrative purposes, these values are not limiting.

The program array 22 loads the fuse set array 20 with information when an address transition to a different memory sector or block is detected. An address which corresponds to four bits <3:0> of a sector or block address which corresponds to an incoming column address <9:0> carried on line 292 and identifying a sector or block, is carried on line 294 and decoded by address transition detection circuit 255 and the row decoder 260. The row decoder 260 decodes the 4 bit sector or block address <3:0> and activates a corresponding one of the row word lines $WL_0$ . . . $WL_{14}$, when address transition detection circuit 255 detects that a sector or block address transition has occurred by a change in the contents of the sector or block address <3:0>. It then outputs a signal on line 206, permitting latch 216 to be loaded with data from memory cells associated with the selected word line ($WL_0$ . . . $WL_{14}$) from the program array 20. The Fbias line 208, acting as an isolation circuit, enables transistor 211 and permits latch 216 to be loaded. The Fbias line is also used to isolate the latches 216 from the program array 22 during programming of the array by programming decoder 250. It should be noted that data is stored in program array 22 using flash memory transistors connected at their gates to the word lines $WL_0$ . . . $WL_{14}$.

Thus, the row decoder 260 decodes the sector or block address <3:0> on line 294, activates the appropriate word line 210 ($WL_0$ . . . $WL_{14}$) to load the data from the selected word line into latches 216. After time sufficient to load latches 216 with the logic states, the Fbias line 208 is subsequently disabled, thereby isolating the latches 216 from program array 22. In another embodiment, the Fbias line 208 and word line 210 remains enabled. The information loaded from the program array 22 remains stored in the latches 216. In this exemplary embodiment, data loaded from the program array 22 contains ten (10) bits of address data for comparison with an incoming column address and five (5) bits of re-addressing data.

Figure 5:
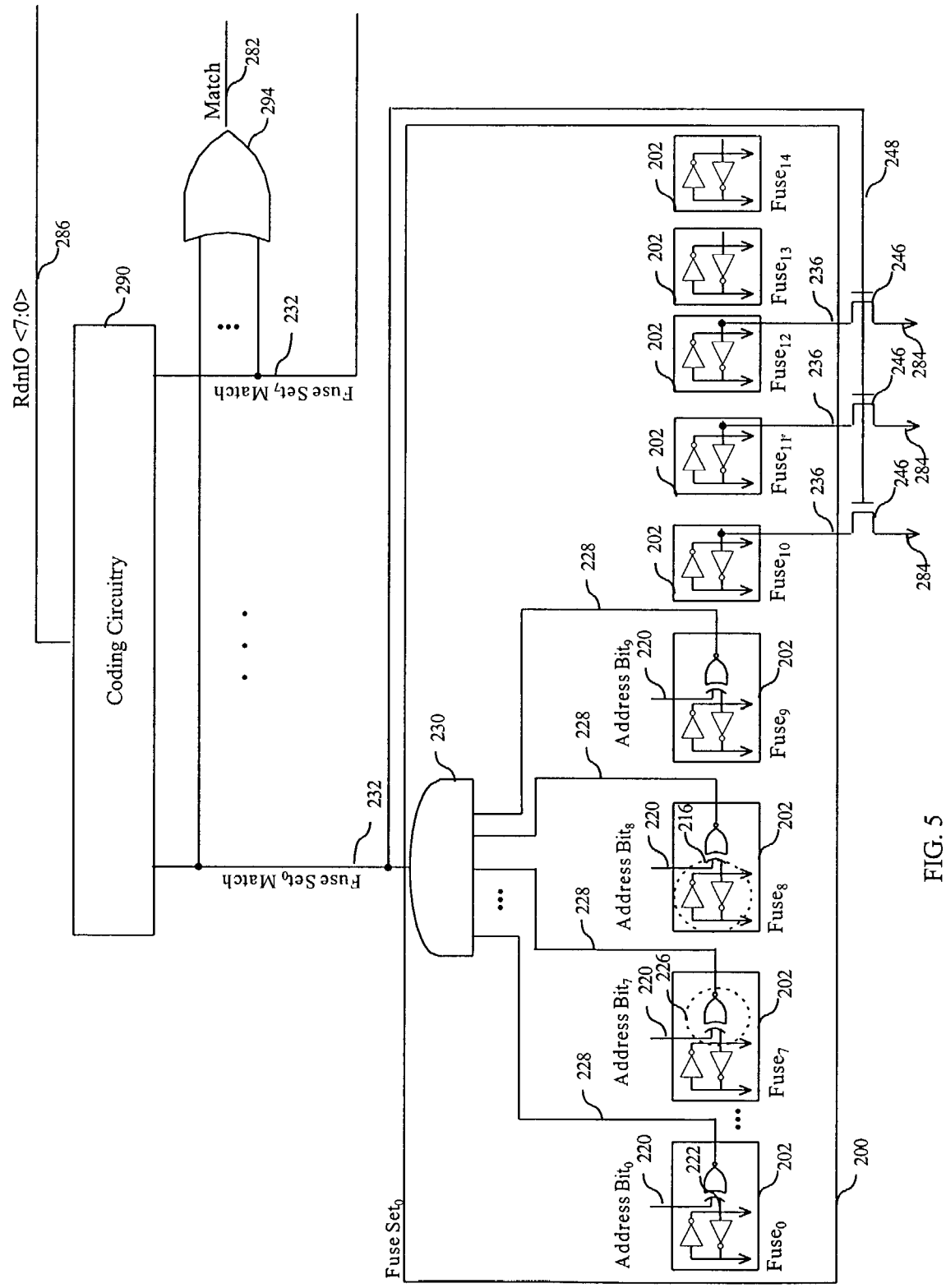
FIG. 5 is a schematic diagram showing further details of the FIG. 2 embodiment.

FIG. 5 represents a more detailed illustration of the fuses 202 in Fuse Set$_0$ 200 of FIG. 4. It should also be noted that data is stored in the flash memory transistors of program array 22 in complementary fashion. Thus, each data element is stored as a 01 or 10 pattern which pattern is applied to each latch 216 from program array 22. FIG. 5 illustrates how each of the latches 216 for fuses Fuse$_0$ ... Fuse$_9$ which is loaded with a bit of an address of a defective column has its output coupled to one input of an XOR gate 222. The XOR gate 222 also receives at its other input a corresponding bit of an incoming column address on line 220. Thus, XOR gates 222 are used as part of an address comparator; the other part of the address comparators being AND gate 230.

The address comparators formed by logic gates 222 and 230 compares an incoming address <9:0>in line 220 with the addresses stored in the fuse sets 200 to determine if the incoming address is a defective address. In the embodiment shown, the ten (10) bits of the incoming address on lines 220 are compared to the ten (10) bits of the stored memory address stored in latches 216. If all ten (10) of the incoming address bits match all ten (10) stored address bits in a single fuse set 200, then a match is true as indicated at the output of AND gate 230, indicating that a defective column is being addressed and that column substitution is to take place.

The information stored in the latches of fuses Fuse$_{10}$ ... Fuse$_{12}$ provides redundant column location information for the output circuit and its use is described below. Lines 284 of FIG. 5 correspond to the output RIO <2:0> shown in FIG. 2. The information stored in the latches 216 in Fuse$_{10}$ ... Fuse$_{12}$, represent which output line of multiple bit output lines dQ$_0$ ... dQ$_7$ a redundant column associated with Fuse Set$_0$ should be coupled to. The data on lines 284 must pass through pass gates 246 which are activated whenever AND gate 230 of Fuse Set$_0$ indicates an address match. Therefore, the only control information on lines 284 RIO <2:0> is derived from the fuse set 200 which corresponds to a matched incoming address. The fuses Fuse$_3$ and Fuse$_{14}$ can receive additional information from the look up table, such as enable or disable information which can be used as control information. Although the exemplary embodiment indicates three bits of addressing information (e.g., <2:0>) being used for the RIO, other embodiments may use different number of bits, for example, eight bits might be used.

If a match occurs, a redundant column replaces the addressed defective column. As indicated above, part of the readdressing information contained in the program array 22 and loaded into the latches of the logic array 20 is carried on RIO <2:0> lines 284. The other readdressing information is determined by the logic array 20. Using the result of the comparison of each fuse set 200 output on lines 232 coding circuitry 290 generates a mask data reflecting which fuse set 200 of the eight fuse sets 200 indicates an address match and outputs the result on line 286 by making one of the eight bit patterns RdnIO <7:0> different from the others. For example, if an incoming address matches the address stored in latches in second fuse set 200, Fuse Set$_1$, then the coding circuitry 290 generates "00000010" indicating that Fuse Set$_1$ had a match. FIG. 5 also generates another match signal on line 282 from OR gate 294 whenever any one of fuse sets 200 has a defective address match.

Figure 6:
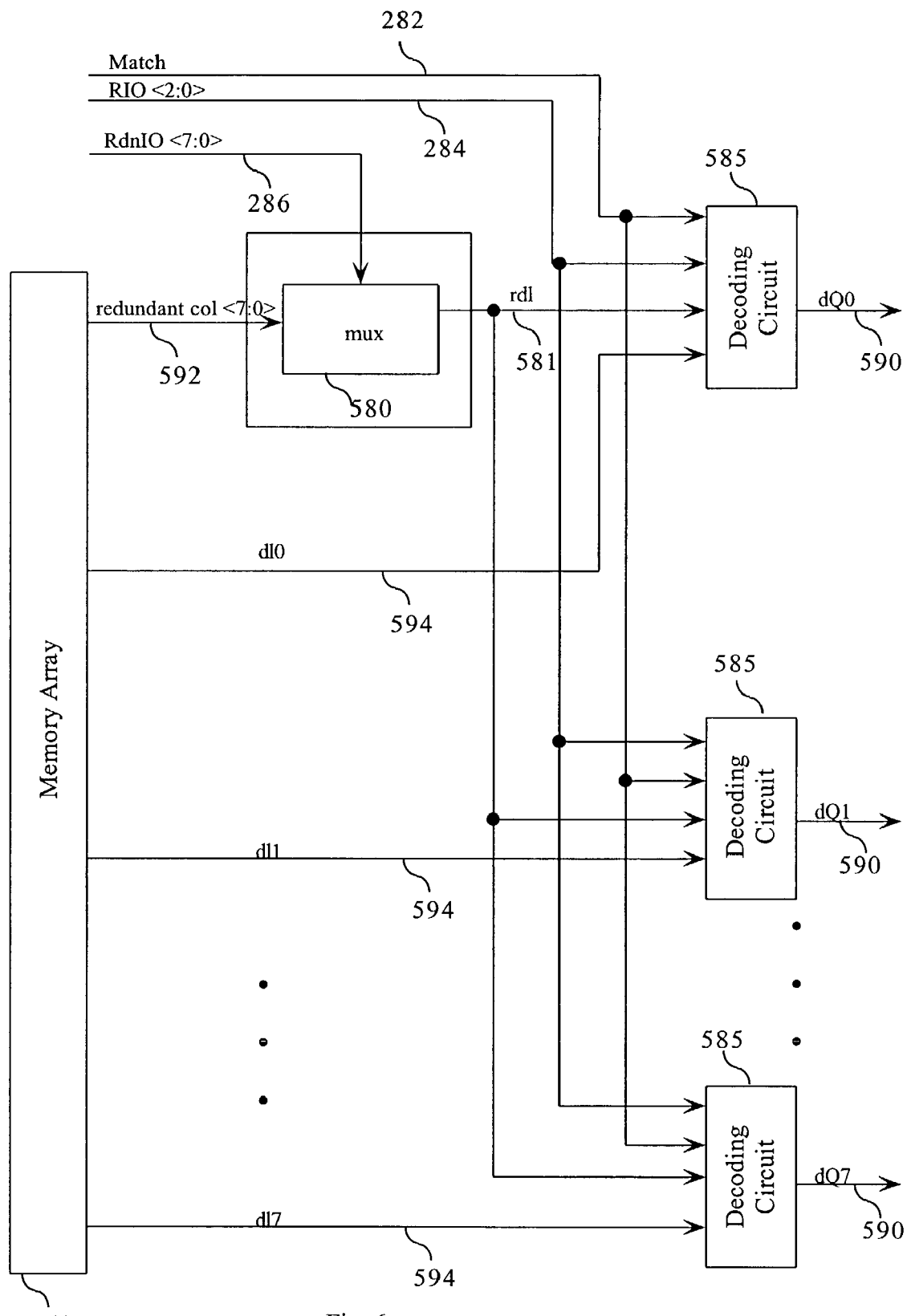
FIG. 6 is a schematic diagram showing circuitry for defective column replacement.

FIG. 6 illustrates the memory output circuitry that substitutes a defective column with a redundant column. A multiplexer 580 selects a redundant column associated with the fuse set 200 which had an address match to replace the defective column based on the selection information carried on line 286 which indicates which of the eight redundant columns input to multiplexer 580 is to be used for substitution. The result of the selection is output on line 581. For example, if the information carried on line 286 indicates that the second redundant data line associated with the second fuse set is to be used for substitution, i.e., "00000010", then the second redundant column of the eight redundant columns on lines 592 is switched by multiplexer 580 to line 581.

Lines 594 carry the normal column data from memory array 560 into each of the eight I/O decoding circuits 585. Decoding circuits 585 also input the redundant column information on line 581, selection information RIO <2:0> on line 284 and a match value on line 282. Using the selection information RIO <2:0> the decoding circuit 585 selects between the redundant column on lines 581 and column data on lines 594 to be output from the circuit. For example, if the logic value of the match line 282 is false, which indicates no defective column address was matched, the information carried on lines 594 is output on lines 590. If, however, the match value has a logical value of true, then the selection information carried on lines 284 is applied to the decoding circuits 585 instructing one of them to substitute the redundant data line 581 for the actual column data line 594.

For example, if RIO <2:0> indicates that column line dl1, associated with the data input/output line dQ1 is defective and is to be replaced by a redundant column line, then the decoding circuit 585 associated with output line dQ1 will use the redundant column on line 581 to replace the dl1 line coming into decoding circuit 585 and output the redundant column information as output data dQ1 on line 590.

Figure 7:
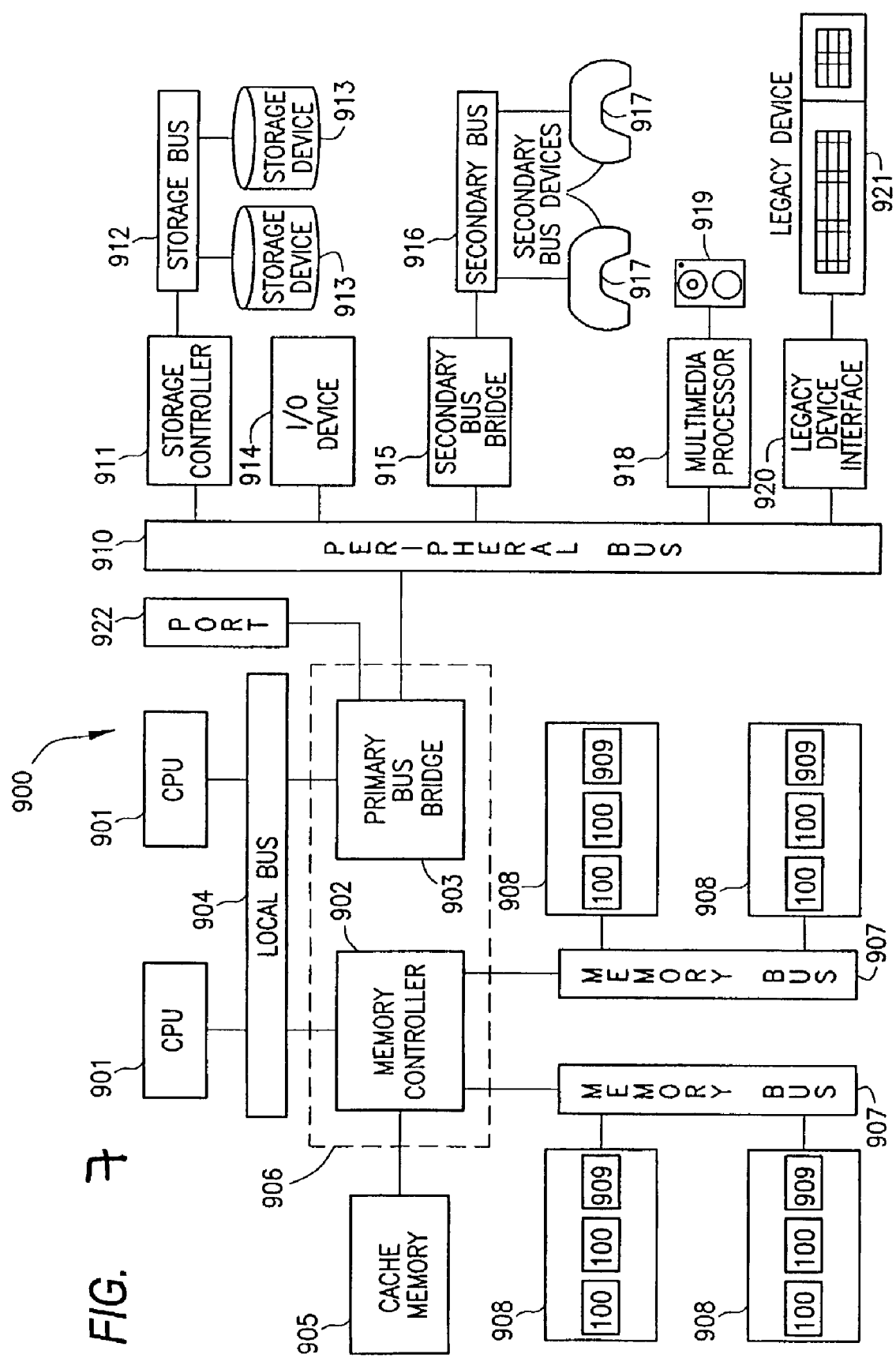
FIG. 7 is a block diagram of a processor system utilizing a method and apparatus of the present invention.

FIG. 7 illustrates an exemplary processing system 900 which may utilize the memory device 100 of the present invention constructed as a flash memory as a DRAM or other type of memory device. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 incorporating the present invention. The memory components 908 may be a memory card or a memory module. Examples of memory modules include flash memory cards, single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 7 is only one exemplary processing system with which the invention may be used. While FIG. 7 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Although the embodiment discussed above describes specific numbers of fuses, fuse arrays, lookup tables and number of redundant columns, the present invention is not so limited. Furthermore, although the invention has been described for use in flash memory systems, the invention may be utilized in any memory system which employs column repair using redundant columns. Additionally, although the foregoing discusses application of the invention to column repair using redundant columns, this method and apparatus may also be applied to row repair as well. For row repair, it is not necessary to store in the program array 22 or in each fuse set 200, the output path selection information loaded into fuses $Fuse_{10} \ldots Fuse_{12}$, as described above with reference to FIG. 5. Moreover, although the description provides for a lookup table using complementary bit lines, an alternative embodiment exists where the latches are each individually accessed by a single bit line. Accordingly, the invention is not to be considered as limited by the foregoing description but is only limited by the scope of the claims.

What is claimed as new and desired to be protected by Letters Patent of the United States is:

1. A memory device, comprising:
    a plurality of memory lines, each associated with a plurality of elements; and
    a memory line remapping circuit for receiving a first address of a selected memory line to be used in a memory operation and for substituting a redundant memory line for the first memory line for use in said memory operation if said first selected memory line is defective;
    said remapping circuit comprising a look up table responsive to at least a portion of said first address to select a second address associated with a defective memory line; a plurality of reloadable latches for receiving and latching said second address and a comparator for comparing said second address with said first address.

2. A memory device as in claim 1, wherein said lookup table comprises a plurality of memory elements arranged in rows and columns, and a row decoder for selecting a row of said lookup table based on said at least portion of said first address, said plurality of latches receiving said second address from a selected row of said lookup table.

3. A memory device as in claim 1 wherein said memory device is a flash memory device.

4. A memory device as in claim 2 wherein said memory device is a flash memory device.

5. A memory device as in claim 1 further comprising an address transition detector for detecting a predetermined address transition in said first address for loading a new selected second address into said plurality of latches.

6. A memory device as in claim 4 further comprising an address transition detector for detecting a predetermined address transition in said first address for loading a new selected second address into said plurality of latches.

7. A memory device as in claim 1 further comprising a programming circuit for programming said lookup table.

8. A memory device as in claim 7 further comprising a gating circuit for selectively decoupling said lockup table from said plurality of latches during programming of said lookup table by said programming circuit.

9. A memory device as in claim 5 wherein said address transition detector enables said plurality of latches upon detection of said address transition.

10. A memory device as in claim 6 wherein said address transition detector enables said plurality of latches upon detection of said address transition.

11. A memory device as in claim 1, wherein said at least portion of said first address comprises at least a memory line.

12. A memory device as in claim 6, wherein said remapping circuit further comprises a redundant memory line address associated with said redundant memory line; said redundant memory line address associated and stored with said second address in said look up table.

13. A memory device as in claim 12, wherein said remapping circuit further comprises:
    a latch address for identifying said plurality of latches; and
    a redundant line selection circuit for receiving and applying said latch address and selecting said redundant memory line.

14. A memory device as in claim 13, wherein said remapping circuit further comprises a logic value indicating when said first address of a selected memory line is equivalent to said second memory address.

15. A memory device as in claim 14, wherein said remapping circuit further comprises:
a redundant line substitution circuit for substituting said selected redundant memory line for said first memory line, said redundant line substitution circuit receiving and responsive to said first memory line, said selected redundant memory line, said redundant memory line address, and said logic value.

16. A memory device as in claim 1 wherein said memory line is a memory column line.

17. A memory device as in claim 9 wherein said memory line is a memory column line.

18. A memory device as in claim 10 wherein said memory line is a memory column line.

19. A memory device as in claim 13 wherein said memory line is a memory column line.

20. A memory device as in claim 15 wherein said memory line is a memory column line.

21. A memory device as in claim 1 wherein said memory line is a memory row line.

22. A memory device as in claim 9 wherein said memory line is a memory row line.

23. A memory device as in claim 10 wherein said memory line is a memory row line.

24. A memory device as in claim 13 wherein said memory line is a memory row line.

25. A processor system comprising:
a processor; and
a memory device for exchanging data with said processor, said memory device comprising:
a plurality of memory lines;
a memory line remapping circuit for receiving a first address of a selected memory line to be used in a memory operation and for substituting a second memory line for the first memory line for use in said memory operation;
said memory line remapping circuit comprising a look up table responsive to said first address to select a second address of said second memory line and a plurality of reloadable latches for receiving and latching said second address.

26. A processor system as in claim 25, wherein said lookup table comprises a plurality of memory elements arranged in rows and columns, and a row decoder for selecting a row of said lookup table based on said at least portion of said first address, said plurality of latches receiving said second address from a selected row of said lookup table.

27. A processor system as in claim 25 wherein said memory device is a flash memory device.

28. A processor system as in claim 26 wherein said memory device is a flash memory device.

29. A processor system as in claim 25 further comprising an address transition detector for detecting a predetermined address transition in said first address for loading a new selected second address into said plurality of latches.

30. A processor system as in claim 28 further comprising an address transition detector for detecting a predetermined address transition in said first address for loading a new selected second address into said plurality of latches.

31. A processor system as in claim 25 further comprising a programming circuit for programming said lookup table.

32. A processor system as in claim 31 further comprising a gating circuit for selectively decoupling said lookup table from said plurality of latches during programming of said lookup table by said programming circuit.

33. A processor system as in claim 32 wherein said address transition detector enables said plurality of latches upon detection of said address transition.

34. A processor system as in claim 30 wherein said address transition detector enables said plurality of latches upon detection of said address transition.

35. A processor system as in claim 25, wherein said at least portion of said first address comprises at least a memory line.

36. A processor system as in claim 30, wherein said remapping circuit further comprises a redundant memory line address associated with said redundant memory line; said redundant memory line address associated and stored with said second address in said look up table.

37. A processor system as in claim 36, wherein said remapping circuit further comprises:
a latch address for identifying said plurality of latches; and
a redundant line selection circuit for receiving and applying said latch address and selecting said redundant memory line.

38. A processor system as in claim 37, wherein said remapping circuit further comprises a logic value indicating when said first address of a selected memory line is equivalent to said second memory address.

39. A processor system as in claim 38, wherein said remapping circuit further comprises:
a redundant line substitution circuit for substituting said selected redundant memory line for said first memory line, said redundant line substitution circuit receiving and responsive to said first memory line, said selected redundant memory line, said redundant memory line address, and said logic value.

40. A processor system as in claim 25 wherein said memory line is a memory column line.

41. A processor system as in claim 33 wherein said memory line is a memory column line.

42. A processor system as in claim 34 wherein said memory line is a memory column line.

43. A processor system as in claim 37 wherein said memory line is a memory column line.

44. A processor system as in claim 39 wherein said memory line is a memory column line.

45. A processor system as in claim 25 wherein said memory line is a memory row line.

46. A processor system as in claim 33 wherein said memory line is a memory row line.

47. A processor system as in claim 34 wherein said memory line is a memory row line.

48. A processor system as in claim 37 wherein said memory line is a memory row line.

49. A method of operating a memory device, said method comprising:
receiving a first address of a selected a memory line for a memory operation;
receiving a second address to select a third address from a lookup table, said second address corresponding to said first address; and
loading said third address into a plurality of reloadable latches,
using said third address to substitute a redundant memory line for a defective memory line.

50. A method as in claim 49 wherein said selecting said third address comprises decoding said at least portion of said second address to select a row of said lookup table and loading said third address from said selected row into said plurality of latches.

51. A method of claim 50 further comprising detecting a transition in said second address to a new second address, using a portion of said new second address to select a new third address, and loading said new third address into said plurality of latches in response to said detection.

52. A method as in claim 49 wherein said memory device is a flash memory.

53. A method as in claim 49 wherein said lookup table comprises flash memory.

54. A method as in claim 52, further comprising scoring a redundant memory line address with said third addiess in said look up table.

55. A method as in claim 54, further comprising selecting said redundant memory line associated with said plurality of latches.

56. A method as in claim 55, further comprising:
    selecting a data output associated with said redundant memory line address; and
    substituting said first memory line of said selected data output with said selected redundant memory line if said comparing is true.

57. A method as in claim 49 wherein said memory line is a column.

58. A method as in claim 50 wherein said memory line is a column.

59. A method as in claim 49 wherein said memory line is a column.

60. A method as in claim 55 wherein said memory line is a column.

61. A method as in claim 56 wherein said memory line is a column.

62. A method as in claim 49 wherein said memory line is a row.

63. A method as in claim 50 wherein said memory line is a row.

64. A method as in claim 49 wherein said memory line is a row.

65. A method as in claim 55 wherein said memory line is a row.

* * * * *

UNITED STATES PATENT AND TRADEMARK OFFICE
CERTIFICATE OF CORRECTION

| | |
|---|---|
| PATENT NO. | : 7,120,068 B2 |
| APPLICATION NO. | : 10/206044 |
| DATED | : October 10, 2006 |
| INVENTOR(S) | : Vinod Lakhani et al. |

It is certified that error appears in the above-identified patent and that said Letters Patent is hereby corrected as shown below:

In the Specification, the following errors are corrected:

Column 3:

Line 6, "maybe" should read --may be--; and

Line 31, "a incoming" should read --an incoming--.

Column 6:

Line 58, "include" should read --includes--.

Column 7:

Line 3, "an legacy" should read --a legacy--;

Line 4, "also coupled" should read --also be coupled--;

Line 18, "an universal" should read --a universal--;

Line 22, "to one additional" should read --to additional--; and

Line 41, "system" should read --systems--.

UNITED STATES PATENT AND TRADEMARK OFFICE
CERTIFICATE OF CORRECTION

PATENT NO. : 7,120,068 B2
APPLICATION NO. : 10/206044
DATED : October 10, 2006
INVENTOR(S) : Vinod Lakhani et al.

It is certified that error appears in the above-identified patent and that said Letters Patent is hereby corrected as shown below:

In the Claims, the following errors are corrected:

Claim 2, column 8, line 24, "least portion" should read --least a portion--;

Claim 26, column 9, lines 48-49, "least portion" should read --least a portion--;

Claim 35, column 10, line 10, "least portion" should read --least a portion--; and Claim 50, column 10, line 64, "least portion" should read --least a portion--.

Signed and Sealed this

Sixteenth Day of January, 2007

JON W. DUDAS
*Director of the United States Patent and Trademark Office*